United States Patent

Shin

[11] Patent Number: 5,821,669
[45] Date of Patent: Oct. 13, 1998

[54] VIBRATION WAVE MOTOR HAVING PIEZOELECTRIC PRESSURE MEMBER

[75] Inventor: Seong-Soo Shin, Suwon, Rep. of Korea

[73] Assignee: Samsung Electronics Co., Ltd., Kyungki-Do, Rep. of Korea

[21] Appl. No.: 872,136

[22] Filed: Jun. 10, 1997

[30] Foreign Application Priority Data

Jun. 11, 1996 [KR] Rep. of Korea ................... 1996-20793

[51] Int. Cl.⁶ .............................. H02N 2/00; H01L 41/08
[52] U.S. Cl. ........................... 310/323; 310/316; 310/317
[58] Field of Search ..................................... 310/316, 323, 310/317

[56] References Cited

U.S. PATENT DOCUMENTS 4,692,651  9/1987  Hiramatsu et al. ..................... 310/323
5,589,723 12/1996  Yoshida et al. ......................... 310/328

FOREIGN PATENT DOCUMENTS 62-193568  8/1987  Japan ............................. H02N 2/00

*Primary Examiner*—Thomas M. Dougherty
*Attorney, Agent, or Firm*—Sughrue, Mion, Zinn, Macpeak & Seas, PLLC

[57] ABSTRACT

A vibration wave motor obtains a desired pressure using a piezoelectric device. The vibration wave motor includes a vibrator which is supported by a shaft and has electro-mechanical conversion elements for generating a travelling vibration wave progressing along the circumferential direction around the shaft when a first electrical signal is applied to the vibrator. A rotating unit which has a portion which is in press-contact with a surface of the vibrator, perpendicular to the shaft, rotates around the shaft by the travelling vibration wave generated in the vibrator. A piezoelectric pressure member maintains a desired press-contact between the vibrator and the actuator by a piezoelectric effect generated when a second electrical signal is applied to the piezoelectric pressure member. Thus, a constant pressure can be maintained by detecting the pressure via the piezoelectric pressure member during operation or stop of the vibration motor.

22 Claims, 3 Drawing Sheets

VIBRATION WAVE MOTOR HAVING PIEZOELECTRIC PRESSURE MEMBER

BACKGROUND OF THE INVENTION

1. Field of the Invention

The present invention relates to a vibration wave motor, and more particularly, to a vibration wave motor having a piezoelectric pressure member which can obtain a pressing force of a rotor with respect to a stator using a piezoelectric device.

2. Description of the Related Art

A vibration wave motor called an ultrasonic motor, includes a piezoelectric device which is deformed by an applied voltage. The vibration wave motor obtains a driving force using a deformation of the piezoelectric device. The piezoelectric device and an elastic member attached to the piezoelectric device forms a stator. The elastic member generates a lateral motion component with respect to a rotational shaft of a vibration motor by deformation of the piezoelectric device. The elastic member press-contacts a rotor by the lateral motion component so that the rotor rotates. Therefore, the degree of press-contact at the contact surfaces between the stator and the rotor and a method therefor, become critical factors for determining performance of the vibration wave motor.

FIG. 1 is a front view of a vibration wave motor having a conventional pressure coil spring. A piezoelectric body 2 is attached to an elastic member 4 on the upper surface of which protrusions 6 are attached. The protrusions 6 contact a rotor 8. The protrusions 6 and the rotor 8 have a structure in which the protrusions 6 vibrating in parallel to the rotational axis of the motor enables the rotor 8 to rotate. A bolt-shaped shaft 16 penetrates the center of the piezoelectric body 2, the elastic member 4 and the rotor 8, and engages them with a nut 14. A spring 12 and the nut 14 press-contact the rotor 8 and the protrusions 6. The degree of the press-contact between the rotor 8 and the protrusions 6 is adjusted by the nut 14.

Two periodical voltages having a phase difference therebetween are applied to the piezoelectric body 2, to thereby generate a vibration of contraction and expansion along the direction perpendicular to the rotational axis of the motor. Such a vibration generates a travelling vibration wave on the surface of the elastic member 14. The travelling vibration wave vibrates the protrusions 6 contacting the rotor 8 to make the rotor 8 rotate. A thrust bearing 10 is located between the rotor 8 and the spring 12 to reduce friction between the rotor 8 and the spring 12 so that the rotor 8 smoothly rotates.

However, such a conventional vibration wave motor uses a spring, a bolt, and a nut to obtain a desired press-contact, which makes it difficult to exactly adjust the pressure and to change the pressure during operation of the motor. It is also difficult to maintain a desired pressure due to wear on the nut and bolt or loosened tightness.

An ultrasonic wave motor disclosed in Japanese patent laid-open publication No. Showa 62-193568, uses magnets to press-contact a stator and a rotor. The ultrasonic wave motor uses an electromagnetic force produced by a coil wound in the rotational axis, and magnets to press-contact the stator and the rotor. Since the conventional ultrasonic wave motor should have a coil and magnets due to use of an electromagnetic force to obtain the pressure for a press-contact, the structure becomes complicated and the volume becomes increased. Also, since the coil and magnet should be distanced by a predetermined interval, the electromagnetic force can easily vary due to an external impact. Accordingly, the pressure easily varies and a fine adjustment of the pressure is difficult.

SUMMARY OF THE INVENTION

To solve the above problems, it is an object of the present invention to provide a vibration wave motor having a piezoelectric pressure member which press-contacts a stator and a rotor in the vibration wave motor, to simplify the structure and easily adjust the size of the pressure applied during the stop or operation thereof.

It is another object of the present invention to provide a vibration wave motor having a piezoelectric pressure member which can detect and adjust the size of the pressure.

To accomplish the above object of the present invention, there is provided a vibration wave motor comprising: a shaft; vibration means which is to be supported by the shaft, and having electro-mechanical conversion elements for generating a travelling vibration wave progressing along the circumferential direction around the shaft when a first electrical signal is applied to the vibration means; movable means which is to be rotated around the shaft by the travelling vibration wave generated in the vibration means, and having a portion of movable means which is in press-contact with a surface of the vibration means perpendicular to the shaft; and a piezoelectric pressure member, supported by the shaft, for maintaining a desired press-contact between the vibration means and the movable means by a piezoelectric effect generated when a second electrical signal is applied to the piezoelectric pressure member.

There is also provided a vibration wave motor comprising: a shaft; vibration means supported by the shaft, and having electro-mechanical conversion elements for generating a travelling vibration wave which travels along the circumferential direction around the shaft when a first electrical signal is applied to the vibration means; movable means whose portion press-contacts the surface of the vibration means perpendicular to the shaft, and which rotates around the shaft by the travelling vibration wave generated in the vibration means; a piezoelectric pressure member, supported by the shaft, for press-contacting the vibration means and the movable means by a piezoelectric effect generated when a second electrical signal is applied to the piezoelectric pressure member; and control means for detecting a voltage from the piezoelectric pressure member and varying the second electrical signal applied to the piezoelectric pressure member according to the detected voltage so that a desired pressure for the press-contact is maintained.

BRIEF DESCRIPTION OF THE DRAWINGS

The preferred embodiments are described with reference to he drawings wherein.

DETAILED DESCRIPTION OF THE INVENTION

Preferred embodiments of the present invention will be described in detail with reference to the accompanying drawings.

Figure 1:
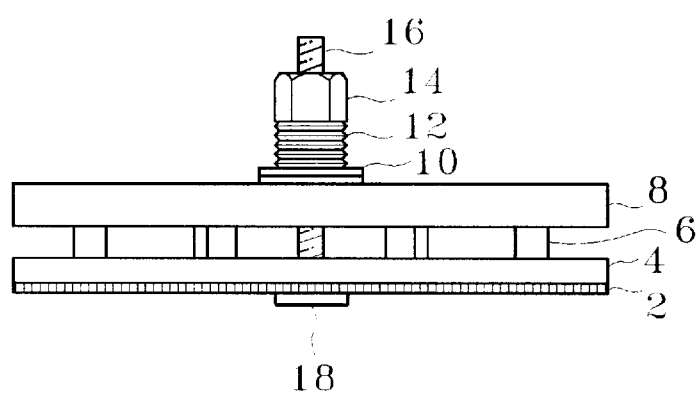
FIG. 1 is a front view of a conventional vibration w motor having a pressure coil spring.
Figure 2:
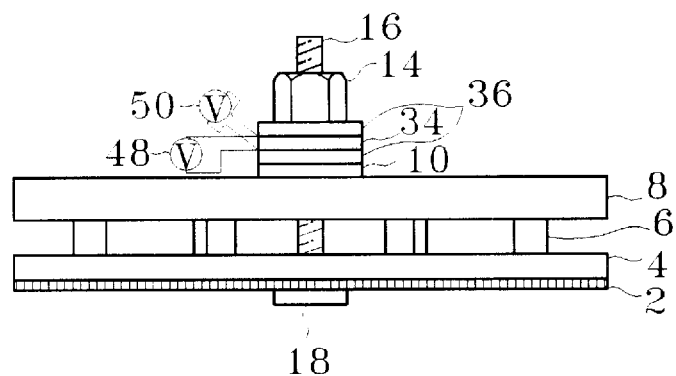
FIG. 2 is a front view of a vibration wave motor having a piezoelectric pressure member according to a preferred embodiment of the present invention.

In a vibration wave motor according to a preferred embodiment of the present invention shown in FIG. 2, components having the same structures and functions as those of FIG. 1 are assigned as the same reference numerals as those of FIG. 1.

Referring to FIG. 2, a piezoelectric body 2 is comprised of a number of piezoelectric elements disposed so that the polarities are changed along the circumferential direction around a shaft 16. The piezoelectric elements contract and expand along the axial direction by electrical signals of voltages having a phase difference therebetween and applied to the piezoelectric body 2. A travelling vibration wave which travels along the circumferential direction around the axis is generated by the expansion and contraction. The piezoelectric body 2, an elastic member 4, and protrusions 6 all of which forms a vibrator are supported by the shaft 16. A rotor 8 which plays a role of movable means has a surface contacting the protrusions 6, and rotates around the axis by the travelling vibration wave. A bearing 10 attached on the upper surface of the rotor 8 is a thrust bearing and plays a role in reducing the frictional force during rotation of the rotor 8. A piezoelectric pressure member 34 provided by the present invention is located on the upper portion of the rotor 8 in the FIG. 2 embodiment. The piezoelectric pressure member 34 which generates a pressure between the rotor 8 and the protrusions 6 according to a voltage applied from a power supply 48, will be described in detail later with reference to FIGS. 3, 4A and 4B. A support plate 36 is located in contact with at least one surface or both surfaces of the piezoelectric pressure member 34. The support plate 36 protects the piezoelectric pressure member 34 from external forces such as wear due to a frictional force with respect to the nut 14 and external impact, and uniformly transfers the pressure generated by the piezoelectric pressure member 34 to the rotor 8. It is preferable that the support plate 36 is located between the nut 14 and the piezoelectric pressure member 34.

The bolt-shaped shaft 16 penetrates the centers of the rotor 8, the bearing 10, the piezoelectric pressure member 34 and the support plate 36, and connects them with the nut 14, and has threads engaging with the nut 14 around the portion contacting the nut 14. A head 18 of the shaft 16 is used for mechanically maintaining and adjusting the distance between the protrusions 6, the rotor 8, or the piezoelectric pressure member 34 and the nut 14. A constant pressure can be maintained even when the vibration wave motor stops or a voltage is not applied to the piezoelectric pressure member 34, by adjusting the nut 14. Also, a pressure proximate to the pressure which can maintain an optimal operational state during the operation of the vibration wave motor, can be obtained.

Figure 3:
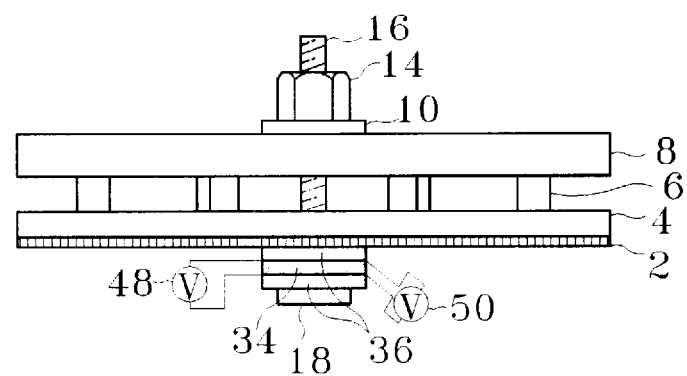
FIG. 3 is a front view of a vibration wave motor having a piezoelectric pressure member according to another pre ed embodiment of the present invention.

The structure of a vibration wave motor according to another embodiment shown in FIG. 3, is the same as the FIG. 2 embodiment except that the piezoelectric pressure member 34 and the support plate 36 are installed between the head 18 of the shaft 16 and the piezoelectric body 2. In the vibration wave motor shown in FIG. 3, since the piezoelectric pressure member 34 is located in a location on the stator's side, a separate brush providing a voltage to the piezoelectric pressure member 34 is not needed.

Figure 4A:
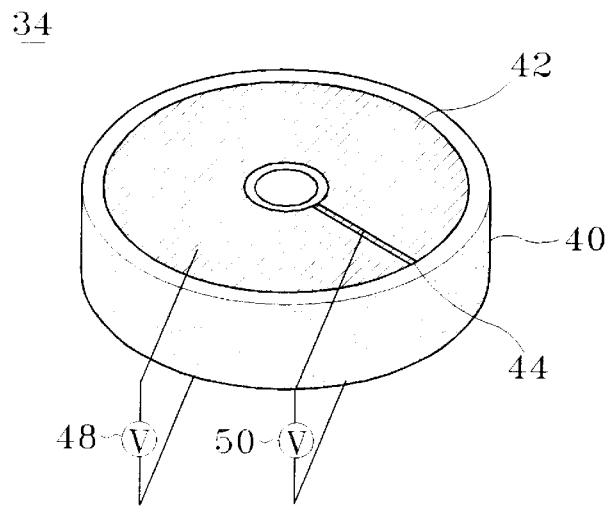
FIGS. 4A and 4B are perspective views of the structures of the upper and lower electrodes in the piezoelectric pressure member, respectively.
Figure 4B:
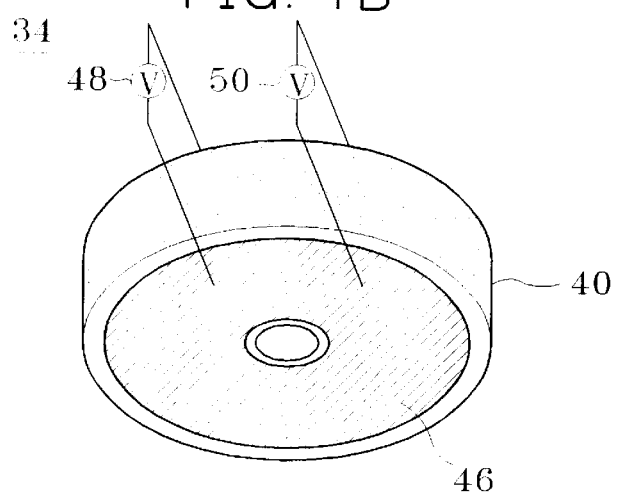

Meanwhile, a general piezoelectric device is divided into two types according to the direction of an applied voltage. That is, they are a longitudinal type creating an axial displacement and a lateral type creating a lateral displacement. FIGS. 4A and 4B show the structures of the electrodes of the piezoelectric pressure member 34 fabricated using the longitudinal type piezoelectric device. Such a piezoelectric pressure member 34 includes a ceramic piezoelectric element 40, a power electrode 42, a detection electrode 44 and a ground electrode 46. The piezoelectric element 40 has a hollow cylindrical shape and extends along the axial direction. The power electrode 42, the detection electrode 44 and the ground electrode 46 are located in the piezoelectric element 40. The detection electrode 46 is located at a distance spaced from the power electrode 42.

The power supply 48 and a detector 50 form a control means. The power supply 48 is connected to the power electrode 42 and the ground electrode 46. The detector 50 is connected to the detection electrode 44 and the ground electrode 46. The power supply 48 provides a voltage necessary for generating a pressure in the piezoelectric element 40. The detector 50 is used for detecting a voltage across the piezoelectric element 40. If the power supply 48 increases the voltage applied across the piezoelectric pressure member 34 the piezoelectric pressure member 34 expands along the axial direction, and if the voltage decreases, the piezoelectric pressure member 34 contracts along the axial direction.

Figure 5:
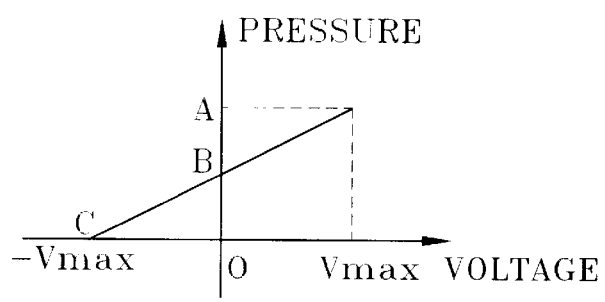
FIG. 5 is a graphical view showing the relationship between a voltage applied to the piezoelectric pressure member and a pressure.

Referring to FIG. 5 depicting the relationship between a voltage applied to the piezoelectric pressure member 34 and the pressure, the pressure linearly increases according to an increase in the voltage applied across the piezoelectric pressure member 34. If the power supply 48 increases, the voltage applied across the piezoelectric pressure member 34 to the maximum value Vmax, the pressure reaches a state "A." If the power supply 48 decreases the voltage applied across the piezoelectric pressure member 34 to "0," that is, no voltage is applied thereto, the pressure becomes an initial set state "B." This is because a constant pressure is applied by the nut 14 during the stop of the piezoelectric ultrasonic motor. If the power supply 48 decreases the voltage applied across the piezoelectric pressure member 34 to the minimum value −Vmax, the pressure reaches a state "C" where any pressure generated by both the piezoelectric pressure member 34 and the nut 14 is not exhibited, in which case, although the protrusions 6 vibrate by the piezoelectric body 2, the rotor 8 does not rotate. When the vibration wave motor operates, the pressure is adjusted via the adjustment of the voltage applied to the piezoelectric pressure member 34, which can rapidly respond to variations in rotational torque, load, or rotational speed. Also, to suddenly stop the rotating vibration wave motor, there is a method for increasing the voltage applied to the piezoelectric pressure member 34 to reach the state "A" shown in FIG. 5, in addition to a method of disconnecting the power of the rotating piezoelectric body 2. Using the latter method, a frictional force between the protrusions 6 and the rotor 8 is increased, to accordingly instantaneously enlarge a stop torque to easily stop the vibration motor.

If the pressure is applied to the piezoelectric pressure member 34, an electrical potential difference is produced between the detection electrode 44 and the ground electrode 46. The detector 50 detects the electrical potential difference. The power supply 48 adjusts the voltage applied to the piezoelectric pressure member 34 during the stop or operation of the piezoelectric ultrasonic motor, in response to the voltage detected in the detector 50, in order to obtain a proper pressure. The detector 50 detects the electrical potential difference between the detection electrode 44 and the ground electrode 46 even in the stop of the vibration wave motor, to thereby prevent the pressure from being reduced due to the wear of the piezoelectric ultrasonic motor.

The above piezoelectric pressure member 34 can be applied to the piezoelectric ultrasonic motors of a ring-shape, a plate-shape, a linear-shape, a rod-shape and a disk-shape classified according to the shape of the stator 4 and the rotor 8. Also, to increase pressure displacement, a plurality of piezoelectric pressure members are used in an overlapping manner. The voltage detected in the piezoelectric pressure member is used as a feedback signal and the voltage of the power supply in the piezoelectric body is used as a control variable, to thus control the piezoelectric ultrasonic motor.

As described above, the vibration wave motor according to the present invention adjusts the voltage applied to the piezoelectric pressure member while adjusting the pressure between the rotor and the portion in contact with and enabling the rotor to rotate, to thereby alter a desired pressure during stop or operation thereof. Also, a constant pressure can be maintained by detecting the pressure during stop and operation of the vibration wave motor. An optimal pressure can be adaptively provided even if there is wear due to a friction of the contact portion between the protrusions and the rotor. Thus, a lifetime and use efficiency of the vibration wave motor are enhanced.

While only certain embodiments of the invention have been specifically described herein, it will be apparent that numerous modifications may be made thereto without departing from the spirit and scope of the invention.

What is claimed is:

1. A vibration wave motor comprising:
   a shaft;
   means for generating a travelling vibration wave using electro-mechanical conversion elements, said vibration wave means being supported by said shaft, and said travelling vibration wave progressing along a circumferential direction around said shaft when a first electrical signal is applied to said vibration wave means;
   means for rotating said electro-mechanical conversion elements around said shaft by the travelling vibration wave generated in said vibration wave means, and having a portion of said rotating means which is in press-contact with a surface of said vibration wave means perpendicular to said shaft; and
   a piezoelectric pressure member, supported by said shaft, for maintaining a desired press-contact between said vibration wave means and said rotating means by a piezoelectric effect generated when a second electrical signal is applied to said piezoelectric pressure member.

2. The vibration wave motor according to claim 1, wherein said piezoelectric pressure member opposes said vibration wave means with respect to said rotating means.

3. The vibration wave motor according to claim 2, further comprising means for protecting said piezoelectric pressure member from friction generated by said rotating means, said protecting means being located between said rotating means and said piezoelectric pressure member.

4. The vibration wave motor according to claim 3, wherein said protecting means is a thrust bearing.

5. The vibration wave motor according to claim 2, further comprising means for transferring the pressure generated by said piezoelectric pressure member to said rotating means to create a uniform pressure between said vibration wave means and said rotating means.

6. The vibration wave motor according to claim 5, wherein said transfer means includes a support plate which opposes said vibration wave means with respect to said piezoelectric pressure member and which protects said piezoelectric pressure member from an external force.

7. The vibration wave motor according to claim 2, comprising means for mechanically maintaining uniform distances among said vibration wave means, said rotating means and said piezoelectric pressure member, said distancing means being installed on said shaft.

8. The vibration wave motor according to claim 7, wherein said distancing means is comprised of threads engraved on said shaft and a nut engaged with said threads.

9. The vibration wave motor according to claim 1, wherein said piezoelectric pressure member opposes said rotating means with respect to said vibration wave means.

10. The vibration wave motor according to claim 9, further comprising means for transferring the pressure generated by said piezoelectric pressure member to said vibration wave means in order to create a uniform pressure between said vibration wave means and said rotating means, said transfer means being located between said vibration wave means and said piezoelectric pressure member.

11. The vibration wave motor according to claim 10, further comprising means for mechanically maintaining uniform distances among said vibration wave means, said rotating means and said piezoelectric pressure member, said distancing means being installed on said shaft.

12. The vibration wave motor according to claim 11, wherein said distancing means is comprised of threads engraved on said shaft, a nut engaged with said threads, and a head fixed on said shaft opposing said nut.

13. The vibration wave motor according to claim 12, further comprising a support plate located between said piezoelectric pressure member and said head, for protecting said piezoelectric pressure member from an electrical force.

14. A vibration wave motor comprising:
   a shaft;
   means for generating a travelling vibration wave using electro-mechanical conversion elements, said vibration wave means being supported by said shaft, and said travelling vibration wave which travels along the circumferential direction around the shaft when a first electrical signal is applied to said vibration wave means;
   means for rotating said electro-mechanical conversion elements, said rotating means whose portion press-contacts a surface of said vibration wave means perpendicular to said shaft, and which rotates around said shaft by the travelling vibration wave generated in said vibration wave means;
   a piezoelectric pressure member, supported by said shaft, for press-contacting said vibration wave means and said rotating means by a piezoelectric effect generated when a second electrical signal is applied to said piezoelectric pressure member; and
   control means for detecting a voltage from said piezoelectric pressure member and varying the second electrical signal applied to said piezoelectric pressure member according to the detected voltage so that a desired pressure for the press-contact is maintained.

15. The vibration wave motor according to claim 14, wherein said piezoelectric pressure member opposes said vibration wave means with reference to said rotating means and generates the pressure for the press-contact according to the second electrical signal.

16. The vibration wave motor according to claim 15, wherein said piezoelectric pressure member comprises a hollow cylindrical piezoelectric element which extends along an axis, a power electrode for supplying the power to said piezoelectric element, a detection electrode for detecting voltage from said piezoelectric element, and a ground electrode.

17. The vibration wave motor according to claim 16, wherein said control means comprises:

a detector coupled to said detection electrode and said ground electrode, for detecting the voltage from said piezoelectric element; and a power supply coupled to said power electrode and said ground electrode, for supplying the second electrical signals of a particular voltage to said piezoelectric element.

18. The vibration wave motor according to claim 14, wherein said control means supplies the second electrical signal of a higher voltage to said piezoelectric pressure member in order to heighten the pressure, and supplies the second electrical signal of a lower voltage in order to lower the pressure.

19. A vibration wave motor comprising:

a shaft;

a vibrator being supported by said shaft and provided for generating a travelling vibration wave, said travelling vibration wave progressing along a circumferential direction around said shaft when a first electrical signal is applied to said vibrator, said vibrator comprising an elastic member having an upper surface on which is provided a plurality of protrusions, and a lower surface on which a piezoelectric body is formed;

a rotor for rotating said elastic member around said shaft by the travelling vibration wave generated in said vibrator, said rotor having an upper surface and a lower surface, said lower surface being in press-contact with said plurality of protrusions of said elastic member, perpendicular to said shaft; and a piezoelectric pressure member, supported by said shaft, for maintaining a desired press-contact between said vibrator and said rotor by a piezoelectric effect generated when a second electrical signal is applied to said piezoelectric pressure member.

20. The vibration wave motor according to claim 19, further comprising:

a bearing provided on said upper surface of said rotor for reducing a frictional force during rotation of said rotor.

21. The vibration wave motor according to claim 19, further comprising:

at least one support plate which opposes said vibrator with respect to said piezoelectric pressure member and which transfers the pressure generated by said piezoelectric pressure member to said rotor to create a uniform pressure between said vibrator and said rotor, said support plate also being provided to protect said piezoelectric pressure member from an electrical force.

22. The a vibration wave motor according to claim 19, further comprising:

a nut; and a head fixed on said shaft opposing said nut;

wherein said head mechanically maintains uniform distances among said vibrator, said rotor, and said piezoelectric pressure member; and wherein said shaft is provided with a plurality of threads engraved on said shaft and said nut engages with said threads.

* * * * *